(12) United States Patent
Kim et al.

(10) Patent No.: US 10,351,468 B1
(45) Date of Patent: Jul. 16, 2019

(54) METHOD OF FABRICATING LIGHT EMITTING BODY PROTECTION GLASS FOR QUANTUM DOT DISPLAY

(71) Applicants: JINWOO ENGINEERING CO., LTD., Hwaseong-si (KR); Jeonghan An, Hwaseong-si (KR)

(72) Inventors: Taehwan Kim, Hwaseong-si (KR); Hyunyoung Lim, Hwaseong-si (KR)

(73) Assignees: JINWOO ENGINEERING CO., LTD., Hwaseong-si (KR); Jeonghan An, Hwaseong-si (KR)

( * ) Notice: Subject to any disclaimer, the term of this patent is extended or adjusted under 35 U.S.C. 154(b) by 0 days.

(21) Appl. No.: 16/125,960

(22) Filed: Sep. 10, 2018

(30) Foreign Application Priority Data

Jul. 25, 2018 (KR) .......................... 10-2018-0086429

(51) Int. Cl.
 *C03C 15/00* (2006.01)
 *H01L 51/50* (2006.01)
 *H01L 51/52* (2006.01)

(52) U.S. Cl.
 CPC ............ *C03C 15/00* (2013.01); *H01L 51/502* (2013.01); *H01L 51/5237* (2013.01)

(58) Field of Classification Search
 USPC .............................................. 216/48; 257/13
 See application file for complete search history.

(56) References Cited

U.S. PATENT DOCUMENTS

2017/0115561 A1* 4/2017 Yang ..................... G03F 7/0047

\* cited by examiner

*Primary Examiner* — Roberts P Culbert
(74) *Attorney, Agent, or Firm* — Lex IP Meister, PLLC

(57) ABSTRACT

A method for fabricating a light emitting body protection glass for a quantum dot (QD) display is disclosed, which fabricates a quantum dot (QD) hole having a minimum difference in width between a top surface and a bottom surface of the glass. The method includes a masking print step to mask a glass with UV ink to protect the remaining glass parts other than a QD hole, a masking dry step to dry a mask layer printed through the masking print process, an exposure step to UV-cure the mask layer other than the QD hole by irradiating UV light onto the mask layer to protect the glass parts other than the QD hole, a pre-bake step to dry the mask layer printed on the glass in a manner that the dried mask layer adheres closely to the glass, a development step to remove a non-UV-cured and non-exposure mask layer from the entire mask layer so that the glass located adjacent to the QD hole is exposed, a hard-bake step to dry the UV-cured mask layer that is less adhesive to the glass in the development step such that the dried mask layer adheres closely to the glass, a protection film lamination step to allow a protection film to be laminated on the glass located opposite to the QD hole; an etching step to spray etchant onto the glass such that the glass surface exposed by the development step is etched, a delamination step to remove the UV-cured mask layer from the glass surface after completion of the etching step, and a cleaning step to clean the glass. Thus, through execution of the above steps, the mask layer, that has a possibility of being loosely fastened to the glass surface in the exposure and development steps, adheres more closely to the glass surface, such that the QD hole formed by the etching step has a minimum difference in width between the glass surface and the QD-hole bottom surface.

7 Claims, 6 Drawing Sheets

METHOD OF FABRICATING LIGHT EMITTING BODY PROTECTION GLASS FOR QUANTUM DOT DISPLAY

CROSS-REFERENCE TO RELATED APPLICATIONS

This application claims the priority of Korean Patent Application No. 10-2018-0086429 filed on Jul. 25, 2018, in the Korean Intellectual Property Office, the disclosure of which is hereby incorporated by reference in its entirety.

BACKGROUND

1. Technical Field

The present disclosure relates to a method for fabricating a light emitting body protection glass for a quantum dot display, and more particularly to a method for fabricating a light emitting body protection glass for a quantum dot display. The method for fabricating the light emitting body protection glass for the quantum dot (QD) display includes a masking print step for masking a glass with ultraviolet (UV) ink to protect the remaining glass parts other than a quantum dot (QD) hole, and a pre-bake step and a hard-bake step in which a mask layer printed on the glass is dried to adhere more closely to the glass. In addition, the method for fabricating the light emitting body protection glass for the quantum dot (QD) display further includes a protection film lamination step in which a protection film is laminated on the glass located opposite to a quantum dot (QD) hole, an etching step in which etchant is sprayed onto the glass such that a glass surface exposed through an exposure and development step is etched, a delamination step in which a UV-cured mask layer is removed from the glass surface after completion of the etching step, and a cleaning step in which the glass is cleaned. As a result, it is possible to fabricate a quantum dot (QD) hole through which a difference in width between a top surface and a bottom surface of the glass is minimized.

2. Description of the Related Art

Generally, a quantum dot light emitting diode (QLED) display refer to a display for implementing colors using an organic material known as quantum dots (QDs).

The QLED display has been designed to display images or colors through light emission based on quantum dots (QDs), and has recently been classified into an electroluminescent QLED display based on electricity and a fluorescent QLED display based on an external light source.

The fluorescent QLED display includes an LED backlight unit configured to produce a light source, a QLED glass provided with quantum dots (QDs) in a manner that light emission is achieved by the light source of the LED backlight unit, and a liquid crystal display (LCD) unit configured to display images by controlling transmission of the light source formed of RGB lights emitted to the QLED glass upon receiving a control signal from a controller.

The QLED glass for the above-mentioned fluorescent QLED display includes a light emitting body protection glass, quantum dots (QDs) filled in quantum dot holes (QD holes) of the light emitting body protection glass, and a cover glass configured to cover the quantum dot holes (QD holes) of the light emitting body protection glass.

Meanwhile, QD-hole fabrication of the light emitting body protection glass refers to a process for fabricating and forming a QD hole on the glass through glass etching.

However, according to the above-mentioned light emitting body protection glass fabrication method, since the width of a glass surface side increases during fabrication of the QD hole through etching of the glass surface, a difference in width between the glass surface and the QD-hole bottom surface excessively increases, such that resolution and brightness of a displayed image are unavoidably deteriorated due to dispersion of light emitted through the QD hole contained in the light emitting body protection glass.

CITED REFERENCE

Patent Document

Korean Patent Laid-Open Publication No. 10-2017-0015014

SUMMARY

Therefore, the present disclosure has been made in view of the above problems, and it is an object of the present disclosure to provide a technology for obviating problems of the related art in which a difference in width between a glass surface and a QD-hole bottom surface excessively increases due to the increasing width of a glass surface side of a QD hole such that resolution and brightness of a displayed image are unavoidably deteriorated due to dispersion of light emitted through the QD hole contained in the light emitting body protection glass.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

Various embodiments of the present disclosure are directed to providing a method of fabricating a light emitting device protection glass for a quantum dot (QD) display that substantially obviates one or more problems due to limitations and disadvantages of the related art.

In accordance with an aspect of the present disclosure, a method for fabricating a light emitting body protection glass for a quantum dot (QD) display includes a masking print step to mask a glass with UV ink to protect the remaining glass parts other than a QD hole, a masking dry step to dry a mask layer printed through the masking print process, an exposure step to UV-cure the mask layer other than the QD hole by irradiating UV light onto the mask layer to protect the glass parts other than the QD hole, a pre-bake step to dry the mask layer printed on the glass in a manner that the dried mask layer adheres closely to the glass, a development step to remove a non-UV-cured and non-exposure mask layer from the entire mask layer so that the glass located adjacent to the QD hole is exposed, a hard-bake step to dry the UV-cured mask layer that is less adhesive to the glass in the development step such that the dried mask layer adheres closely to the glass, a protection film lamination step to allow a protection film to be laminated on the glass located opposite to the QD hole, an etching step to spray etchant onto the glass such that the glass surface exposed by the development step is etched, a delamination step to remove the UV-cured mask layer from the glass surface after completion of the etching step, and a cleaning step to clean the glass.

DETAILED DESCRIPTION

Figure 1:
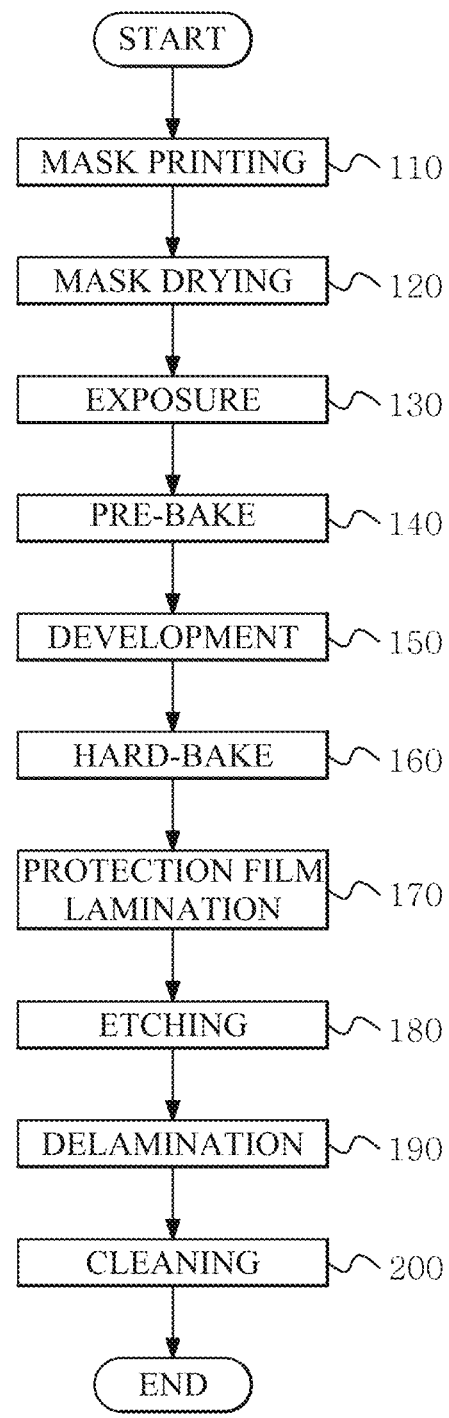
FIG. 1 is a flowchart illustrating a fabrication method according to an embodiment of the present disclosure.
Figure 2:
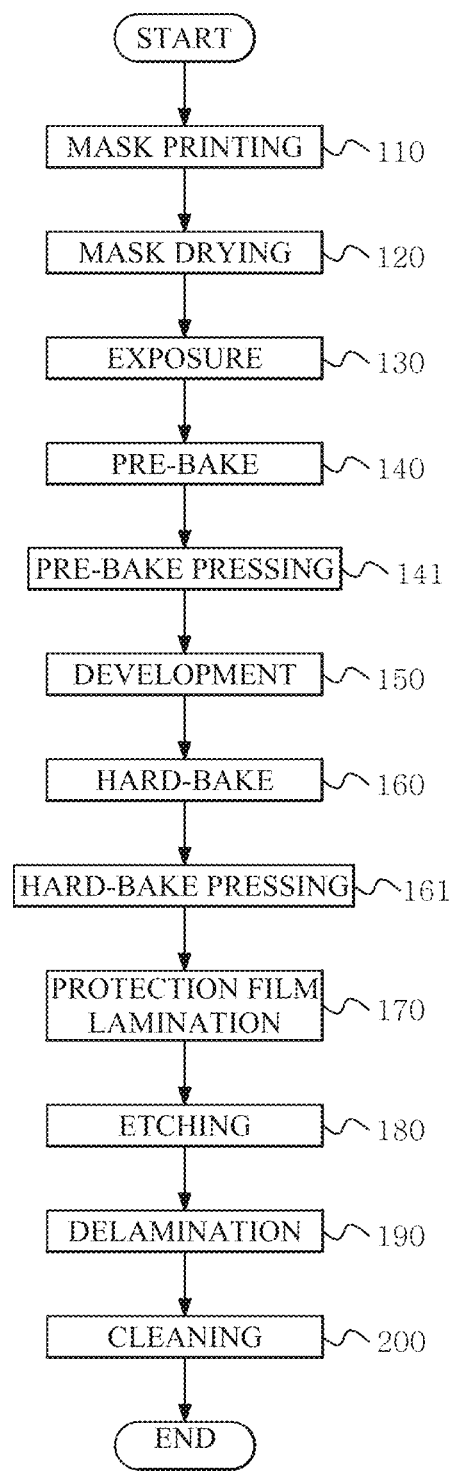
FIG. 2 is a flowchart illustrating a pre-bake pressing process and a hard-bake pressing process according to an embodiment of the present disclosure.
Figure 3:
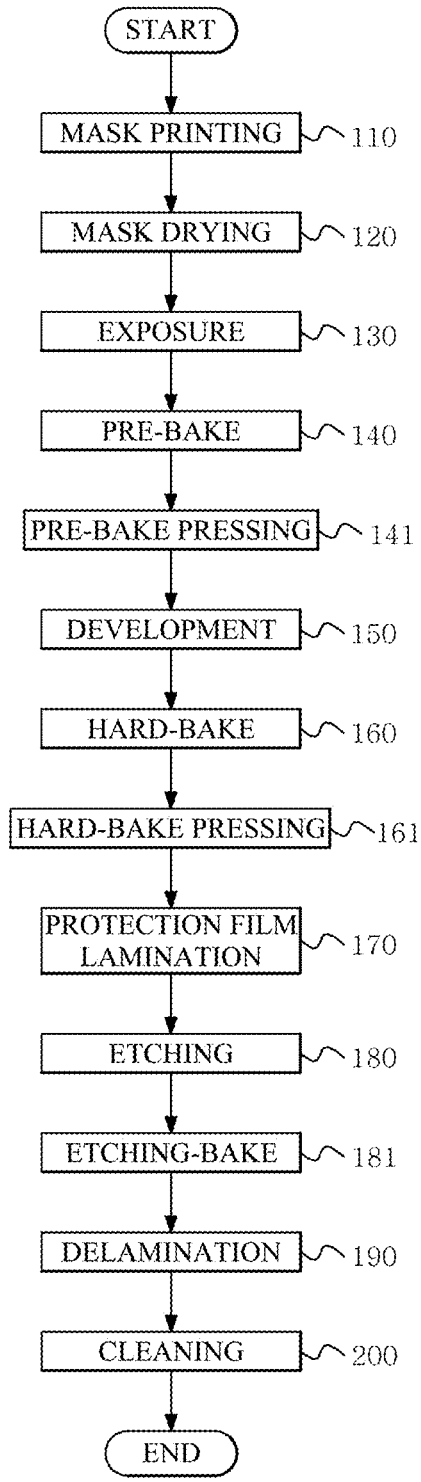
FIG. 3 is a flowchart illustrating an etching-bake process according to an embodiment of the present disclosure.
Figure 4:
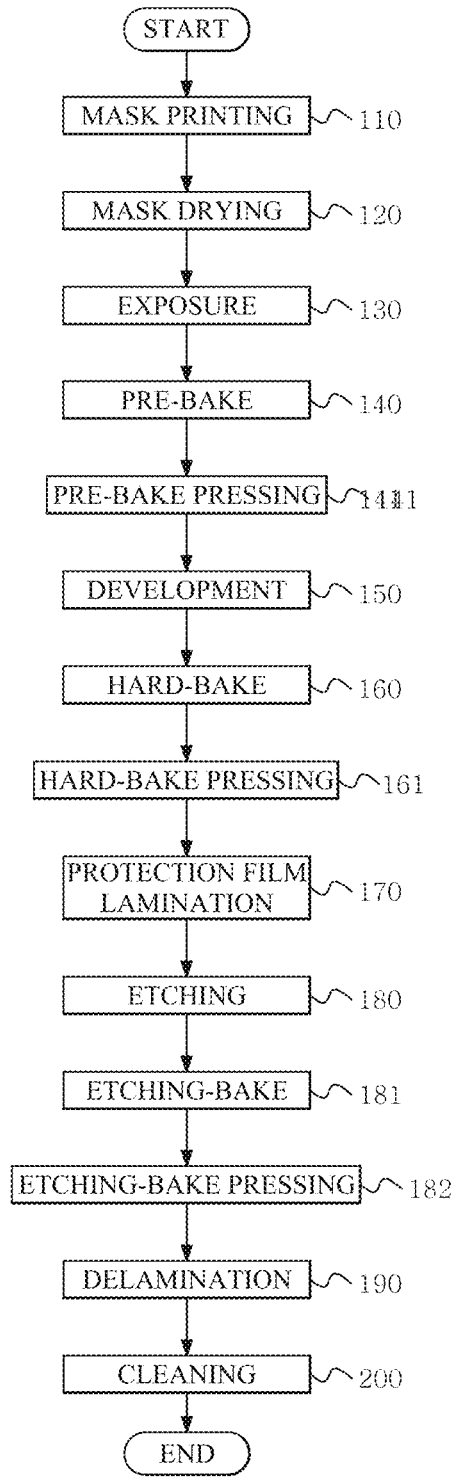
FIG. 4 is a flowchart illustrating an etching-bake pressing process according to an embodiment of the present disclosure.
Figure 5:
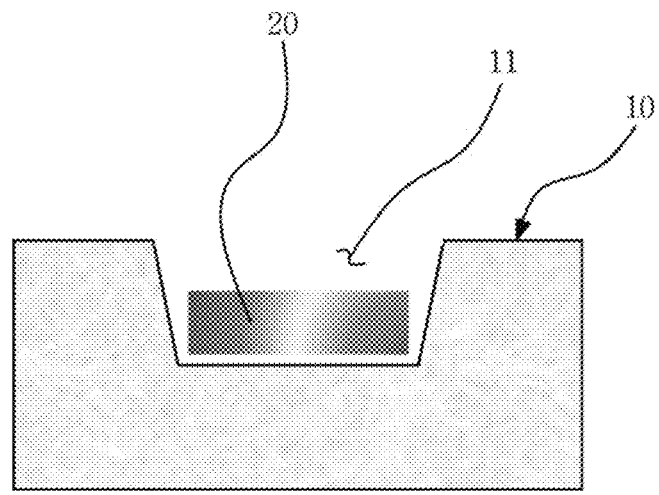
FIG. 5 is a view illustrating an example of a glass according to an embodiment of the present disclosure.
Figure 6:
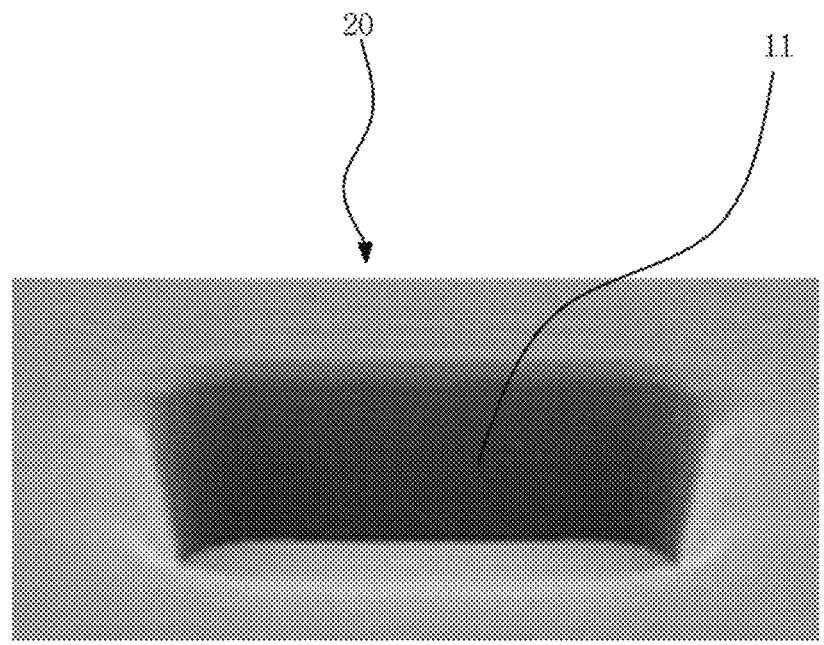
FIG. 6 is a view illustrating an example of a quantum dot (QD) hole according to an embodiment of the present disclosure.
Figure 7:
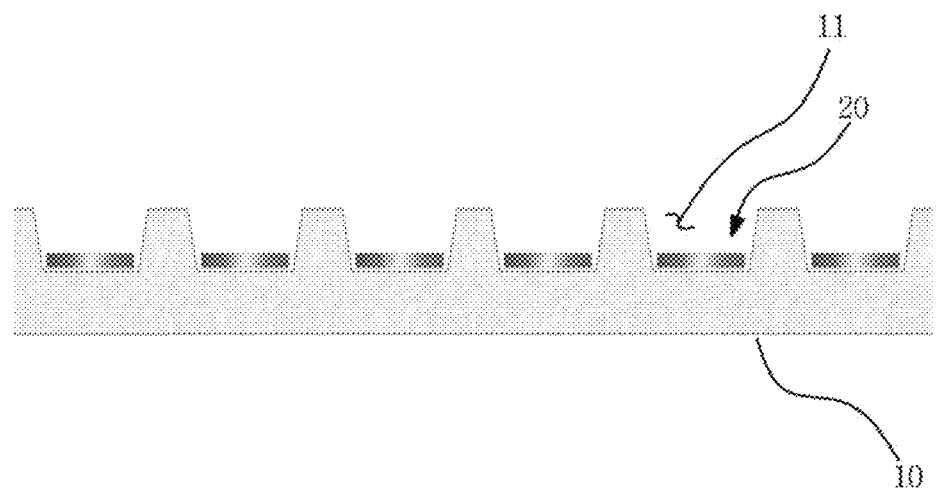
FIG. 7 is a cross-sectional view illustrating a structure according to an embodiment of the present disclosure.
Figure 8:
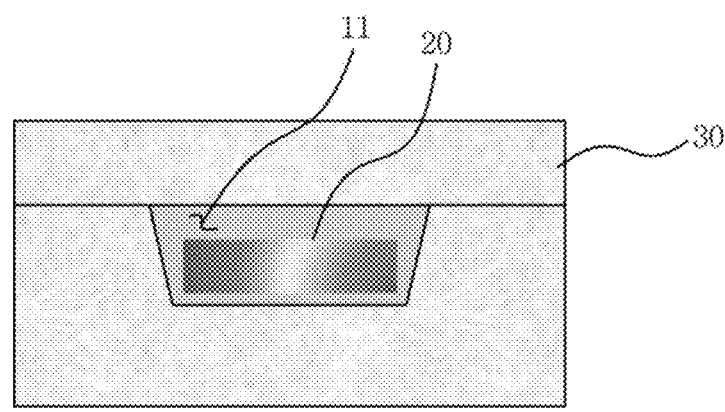
FIG. 8 is a view illustrating a protection glass coupled to a top surface of a glass according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Reference will now be made in detail to certain embodiments, examples of which are illustrated in the accompanying drawings. Prior to description, the terms or words used in the disclosure and the claims are not interpreted as having general meanings or dictionary meanings, but should be interpreted as having meanings and concepts coinciding with the technical scope and sprit of the present disclosure based on the principle in that an inventor may properly define the concept of terms to describe the present disclosure in the best mode. Therefore, the embodiments described in the specification and shown in the drawings are purely illustrative and are not intended to represent all aspects of the invention, such that various equivalents and modifications may be made without departing from the spirit of the invention.

A method for fabricating a light emitting body protection glass for a quantum dot (QD) display according to the embodiments of the present disclosure will hereinafter be described with reference to the attached drawings. The present disclosure allows a mask layer to adhere closely to a glass surface such that it is possible to fabricate a QD hole 11 having a minimum difference in width between a bottom surface of the QD hole 11 and the glass surface. As a result, the present disclosure can improve durability of a socket connector.

In other words, a method for fabricating a light emitting body protection glass for a QD (20) display according to the present disclosure may include a masking print process 110, a masking dry process 120, an exposure process 130, a pre-bake process 140, a development process 150, a hard-bake process 160, a protection film lamination process 170, an etching process 180, a delamination process 190, and a cleaning process 200.

In this case, the masking print process 110 may allow a glass to be masked and printed with UV ink so as to protect the remaining glass parts other than the QD hole 11.

Preferably, the glass for use in the masking print process 110 may be formed of alkali-free glass having uniform chemical durability and reactivity.

The glass for use in the masking print process 110 may be a mother glass.

The glass for use in the masking print process 110 may be a cell glass formed by cutting the mother glass on a cell basis.

The masking dry process 120 may be used to dry the mask layer printed through the masking print process 110.

A temperature for the masking dry process 120 may be 100° C.~130° C., and the masking dry process 120 may be executed during 5~15 minutes.

The exposure process 130 may perform 5~20 mJ/cm$^2$ UV irradiation on the mask layer at a wavelength of 365 nm so as to protect the remaining glass parts other than the QD hole 11 of the glass, such that the masked parts other than the QD hole 11 can be UV-cured.

The pre-bake process 140 may dry the mask layer printed on the glass such that the resultant mask layer can adhere more closely to the glass.

The pre-bake process 140 may perform hot-air drying or IR(infrared)-drying of the mask layer printed on the glass at a temperature of 90° C.~140° C. during 5~15 minutes.

In the pre-bake process 140, a pre-bake pressing process 141 may be used to press the mask layer against the glass such that the resultant mask layer can adhere more closely to the glass.

The development process 150 may remove a non-UV-cured mask layer in a manner that a non-exposure mask layer that is not UV-cured is removed from the entire mask layer so that the glass located adjacent to the QD hole 11 can be exposed.

The hard-bake process 160 may perform drying of the UV-cured mask layer that is less adhesive to the glass in the development process 150, such that the dried mask layer can adhere more closely to the glass.

The hard-bake process 160 may perform hot-air drying or IR-drying of the mask layer at a temperature 130° C.~190° C. during 20~90 minutes.

In the hard-bake process 160, a pre-bake pressing process 161 may be used to press the mask layer against the glass such that the resultant mask layer can adhere more closely to the glass.

The protection film lamination process 170 may allow a protection film to be laminated on the glass located opposite to the QD hole 11.

The etching process 180 may spray etchant onto the glass such that the glass surface exposed by the development process 150 is etched.

The etching process 180 may be achieved by spraying etchant at a lower part of the glass.

The etching process 180 may stand the glass upright, and may spray etchant onto the glass at a side part of the upright glass.

In the etching process 180, it is possible to perform an etching-bake process 181 in which the loosely fastened mask layer having weak adhesive power can adhere more closely to the glass surface such that the width of the QD hole 11 is prevented from increasing with respect to the glass surface.

The etching-bake process 181 may be achieved by performing hot-air drying or IR-drying of the mask layer at a temperature 130° C.~190° C. during 5~100 minutes.

In the etching-bake process 181, it is possible to perform an etching-bake pressing process 182 in which the resultant mask layer obtained from the etching-bake process 181 is pressed.

The delamination process 190 may remove the UV-cured mask layer from the glass surface, after completion of the etching process 180.

The delamination process 190 may remove the residual mask layer from the glass surface using a stripping liquid at a temperature of 50° C.~70° C. during 10~15 minutes, such that the residual particles are not left on the glass surface.

The cleaning process 200 may prevent residual pollution of the glass using pure cleaning water, may clean the glass surface and a patterning region with the pure cleaning water, may remove a spot or afterimage formed in a pattern-etched part, and may perform hot-air drying of the cleaned glass so that humidity or moisture is evaporated from the cleaned glass.

In the meantime, when a current progress step arrives at the delamination process 190 based on the mother glass according to the embodiments of the present disclosure, a cell cutting process in which the glass is cut on a cell basis may be additionally carried out.

The effects of the embodiments of the present disclosure are as follows.

As described above, the method for fabricating the light emitting body protection glass for the QD (20) display according to the embodiments of the present disclosure includes a masking print process 110 for masking a glass with UV ink to protect the remaining glass parts other than a QD hole 11; a masking dry process 120 for drying a mask layer printed through the masking print process 110; an exposure process 130 for UV-curing the mask layer other than the QD hole 11 by irradiating UV light onto the mask layer so as to protect the remaining glass parts other than the QD hole 11; a pre-bake process 140 for drying the mask layer printed on the glass in a manner that the resultant mask layer adheres more closely to the glass; a development process 150 for removing a non-exposure mask layer that was not UV-cured from the entire mask layer so that the glass located adjacent to the QD hole 11 is exposed; a hard-bake process 160 for drying the UV-cured mask layer that is less adhesive to the glass in the development process 150 such that the dried mask layer adheres more closely to the glass; a protection film lamination process 170 for allowing a protection film to be laminated on the glass located opposite to the QD hole 11; an etching process 180 for spraying etchant onto the glass such that the glass surface exposed by the development process 150 is etched; a delamination process 190 for removing the UV-cured mask layer from the glass surface after completion of the etching process 180; and a cleaning process 200 for cleaning the glass. As a result, through execution of the above-mentioned processes 110 to 200, the mask layer, that has a possibility of being loosely fastened to the glass surface in the exposure and development processes 130 and 150, can adhere more closely to the glass surface, such that the resultant QD hole 11 formed by the etching process 180 has a minimum difference in width between the glass surface and the QD-hole bottom surface.

Meanwhile, according to the embodiments of the present disclosure, when a hard-bake pressing process 161 is additionally carried out, the mask layer can adhere more closely to the glass in the hard-bake process 160.

In addition, according to the embodiments of the present disclosure, when an etching-bake pressing process 182 is additionally carried out, the mask layer can adhere more closely to the glass in the etching-bake process 181.

In the drawings, a reference numeral 20 may refer to a quantum dot (QD) filled in the QD hole 11, and a reference numeral 30 may refer to a cover class 30 configured to protect a top surface of the glass 10.

As is apparent from the above description, the embodiments of the present disclosure can fabricate the light emitting body protection glass for the quantum dot (QD) display not only through the masking print process for masking the glass with UV ink to protect the remaining glass parts other than the QD hole, but also through the pre-bake process and the hard-bake process in which a mask layer printed on the glass is dried to adhere more closely to the glass. As a result, the mask layer, which has a possibility of being loosely fastened to the glass surface in the exposure and development process, can adhere closely to the glass surface, such that the resultant QD hole formed by the etching process has a minimum difference in width between a glass surface and a QD-hole bottom surface.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:

1. A method for fabricating a light emitting body protection glass for a quantum dot (QD) display comprising:
    a masking print step configured to mask a glass with ultraviolet (UV) ink so as to protect the remaining glass parts other than a quantum dot (QD) hole;
    a masking dry step configured to dry a mask layer printed through the masking print step;
    an exposure step configured to UV-cure the mask layer other than the QD hole by irradiating UV light onto the mask layer so as to protect the remaining glass parts other than the QD hole;
    a pre-bake step configured to dry the mask layer printed on the glass in a manner that the dried mask layer adheres more closely to the glass;
    a development step configured to remove a non-UV-cured and non-exposure mask layer from the entire mask layer so that the glass located adjacent to the QD hole is exposed;
    a hard-bake step configured to dry the UV-cured mask layer that is less adhesive to the glass in the development step such that the dried mask layer adheres more closely to the glass;
    a protection film lamination step configured to allow a protection film to be laminated on the glass located opposite to the QD hole;
    an etching step configured to spray etchant onto the glass such that the glass surface exposed by the development step is etched;
    a delamination step configured to remove the UV-cured mask layer from the glass surface after completion of the etching step; and
    a cleaning step configured to clean the glass.

2. The method of claim 1, wherein the pre-bake step is achieved by performing hot-air drying or IR(infrared)-drying of the mask layer at a temperature of 90° C.~140° C. during 5~15 minutes, and further includes a pre-bake pressing step for pressing the mask layer such that the resultant mask layer adheres more closely to the glass.

3. The method of claim 1, wherein the hard-bake step is achieved by performing hot-air drying or IR(infrared)-drying of the mask layer at a temperature of 130° C.~190° C. during 20~90 minutes, and further includes a hard-bake pressing step for pressing the mask layer such that the resultant mask layer adheres more closely to the glass.

4. The method of claim 1, wherein the etching step is achieved by spraying etchant onto the glass at a lower part of the glass.

5. The method of claim 1, wherein the etching step (180) includes:
   standing the glass upright; and
   spraying etchant onto the glass at a side part of the upright glass.

6. The method of claim 1, wherein the etching process, it is possible to perform an etching-bake process in which the loosely fastened mask layer having weak adhesive power can adhere more closely to the glass surface such that the width of the QD hole is prevented from increasing with respect to the glass surface;
   the etching-bake process may be achieved by performing hot-air drying or IR-drying of the mask layer at a temperature 130° C.~190° C. during 5~100 minutes.

7. The method of claim 6, wherein the etching-bake step further includes an etching-bake pressing step configured to press the mask layer against the glass.

* * * * *